US005504616A

United States Patent [19]
Shinozaki et al.

[11] Patent Number: 5,504,616
[45] Date of Patent: Apr. 2, 1996

[54] WAVELENGTH CONVERSION DEVICE

[75] Inventors: Keisuke Shinozaki; Takeshi Kamijoh, both of Tokyo, Japan

[73] Assignee: Oki Electric Industry Co., Ltd., Tokyo, Japan

[21] Appl. No.: 310,079

[22] Filed: Sep. 22, 1994

[30] Foreign Application Priority Data

Sep. 22, 1993 [JP] Japan .................................. 5-236274

[51] Int. Cl.$^6$ ...................................................... G02F 1/39
[52] U.S. Cl. ........................... 359/326; 385/122; 359/332
[58] Field of Search ................................... 359/326–332; 385/122; 372/21–23

[56] References Cited

U.S. PATENT DOCUMENTS

| | | | |
|---|---|---|---|
| 5,142,542 | 8/1992 | Dixon | 372/22 |
| 5,185,752 | 2/1993 | Welch et al. | 372/22 |
| 5,195,104 | 3/1993 | Geiger et al. | 359/330 X |
| 5,253,258 | 10/1993 | Lawandy | 372/22 |
| 5,311,352 | 5/1994 | Bierlein et al. | 359/326 |
| 5,388,113 | 2/1995 | Oka | 372/21 |

FOREIGN PATENT DOCUMENTS

| | | |
|---|---|---|
| 0432009 | 6/1991 | European Pat. Off. |
| 0439350 | 7/1991 | European Pat. Off. |
| 0451017 | 10/1991 | European Pat. Off. |
| 5-291655 | 11/1993 | Japan. |

OTHER PUBLICATIONS

Yamamoto et al., "Simultaneous Sum–Frequency And Second–Harmonic Generation From A Proton–Exchanged MgO–Doped LiNbO$_3$ Waveguide," Applied Physics Letters, vol. 58, No. 12 (Mar. 25, 1991), pp. 1227–1229.

Laurell et al., "Simultaneous Generation of UV and Visible Light In Segmented KTP Waveguides," Applied Physics Letters, vol. 62, No. 16 (Apr. 19, 1993), pp. 1872–1874.

O Plus E, Jan., 1993, p. 113.

Lallier et al., "Laser Oscillation Of Single–Mode Channel Waveguide in Nd:MgO:LiNbO3," Electronics Letters vol. 25, No. 22 (Oct. 26, 1989), pp. 1491–1492.

Suhara et al., "Quasi–Phase Matching", Applied Physics (The Japan Society of Applied Physics), vol. 62, No. 9, (1993), pp. 927–928 (no month).

Tatsuno, "Modern Optics for Freshman—VII", Optics vol. 23, No. 1 (Jan. 1994), pp. 58–64.

Shinozaki, et al. "Self–Quasi–Phase–Matched Second–Harmonic Generation in the Proton–Exchanged LINB03 Optical Waveguide with Periodically Domain–Inverted Regions", Applied Physics Letters, vol. 59, No. 5, Jul. 29, 1991, pp. 510–512.

Bierlein, et al. "Balanced Phase Matching in Segmented KTIOP04 Waveguides", Applied Physics Letters, vol. 56, No. 18, Apr. 30, 1990, pp. 1725–1727.

Risk, et al. "Distributed–Bragg–Reflection Properties of Segmented KTP Waveguides", Optics Letters, vol. 18, No. 4, Feb. 15, 1993) pp. 272–274.

*Primary Examiner*—John D. Lee
*Attorney, Agent, or Firm*—Spencer & Frank

[57] ABSTRACT

A wavelength conversion device is formed by adding a laser-active material to a nonlinear optical crystal, and creating a phase-matching structure in the crystal. Light of a first wavelength excites the laser-active material, generating laser light of a second wavelength. Nonlinear optical effects then generate further wavelengths, such as the second harmonic of the first wavelength, the second harmonic of the second wavelength, the sum frequency of the first and second wavelengths, and the difference frequency of the first and second wavelengths. Multiple output wavelengths are thereby obtained from a single input wavelength. Because of the phase matching structure, the output is aligned in the same direction as the input light.

9 Claims, 6 Drawing Sheets

WAVELENGTH CONVERSION DEVICE

BACKGROUND OF THE INVENTION

The present invention relates to a device that converts coherent input light, such as light from a semiconductor laser diode, to output light differing in wavelength from the input light.

There is considerable interest in converting light from, for example, the red or infrared wavelengths emitted by semiconductor laser diodes to shorter visible wavelengths. One known method of effecting such a conversion is to input coherent light into a nonlinear optical crystal, which generates light with twice the frequency (half the wavelength) of the input light. This process is referred to as second-harmonic generation (SHG). If two different wavelengths are input, the nonlinear optical crystal may generate light with the sum or difference of the two input frequencies, a process known as sum-frequency generation (SFG) or difference-frequency generation (DFG). SHG, SFG, and DFG depend on the law of energy conservation and certain phase-matching conditions, as will be described below.

Prior Art 1

FIG. 1 shows an apparatus that is disclosed in Yamamoto et al., "Simultaneous sum-frequency and second-harmonic generation from a proton-exchange MgO-doped LiNbO$_3$ waveguide," Applied Physics Letters, Vol. 58, No. 12 (March 25, 1991), pp. 1227–1229, and has been used to generate red, green, and blue output light from input light with two infrared wavelengths. Referring to FIG. 2, the wavelength conversion device 10 comprises a lithium-niobate (LiNbO$_3$) substrate 11 doped with magnesium oxide (MgO), on which an optical waveguide 13 is formed by the proton-exchange method, using pyrophosphoric acid (H$_4$P$_2$O$_7$). Two semiconductor laser diodes 15a and 15b generate beams of infrared light with wavelengths of 0.86 μm ($\lambda_1$) and 1.3 μm ($\lambda_2$), which are combined by a dichroic mirror 17. A mirror 19 reflects the beam from laser diode 15b to the dichroic mirror 17. Lenses 21a and 21b focus the beams from the laser diodes, and a third lens 23 directs the mixed beam from the dichroic mirror 17 into the waveguide 13. In the waveguide 13, nonlinear optical effects generate light of wavelengths 0.43 μm ($\lambda_3$, the second harmonic of $\lambda_1$), 0.65 μm ($\lambda_4$, the second harmonic of $\lambda_2$), and 0.52 μm ($\lambda_5$, the sum frequency of $\lambda_1$ and $\lambda_2$).

The mathematical relationships between the input wavelengths ($\lambda_1$, $\lambda_2$) and output wave lengths ($\lambda_3$, $\lambda_4$, $\lambda_5$) are:

$$\lambda_3 = \lambda_1/2 \quad (1)$$

$$\lambda_4 = \lambda_2/2 \quad (2)$$

$$\lambda_5^{-1} = \lambda_1^{-1} + \lambda_2^{-1} \quad (3)$$

If the wave vectors of the light of wavelengths $\lambda_1$, $\lambda_2$, $\lambda_3$, $\lambda_4$, and $\lambda_5$ are $k_1$, $k_2$, $k_3$, $k_4$, and $k_5$, then the necessary phase-matching conditions are:

$$k_3 = 2k_1 \quad (4)$$

$$k_4 = 2k_2 \quad (5)$$

$$k_5 = k_1 + k_2 \quad (6)$$

In the device of FIG. 1, the output light was obtained by a Cherenkov radiation scheme which facilitates satisfaction of the phase-matching conditions, because the output light does not propagate in waveguide mode and the wave vectors need not be aligned in the same direction. An undesirable consequence, however, is that the three output wavelengths propagate in different directions, and the second-harmonic outputs have a characteristic crescent shape which cannot be focused by an ordinary convex lens. These properties are a hindrance to many applications.

Prior Art 2

FIG. 2 shows another wavelength conversion device that is disclosed in Laurell et al., "Simultaneous generation of UV and visible light in segmented KTP waveguides," Applied Physics Letters, Vol. 62, No. 16 (Apr. 19, 1993), pp. 1872–1874, and has been used to generate multiple output wavelengths from two input wavelengths. This device is configured as a segmented waveguide 31 having alternating sections 31a and 31b with differing optical properties. The waveguide 31 is made of potassium titanyl phosphate (KTiOPO$_4$, commonly abbreviated as KTP). The grating structure of the segmented waveguide 31 can satisfy the phase-matching conditions for SHG and SFG, and all output light is emitted in the same direction.

To describe how the phase-matching conditions are satisfied, it is useful to introduce phase mismatch terms $\Delta k_1$, $\Delta k_2$, and $\Delta k_3$, which are defined in relation to the above input wave vectors $k_1$ and $k_2$ and output wave vectors $k_3$, $k_4$, and $k_5$ as follows.

$$\Delta k_1 = k_3 - 2k_1 \quad (7)$$

$$\Delta k_2 = k_4 - 2k_2 \quad (8)$$

$$\Delta k_3 = k_5 - k_1 - k_2 \quad (9)$$

Since all propagation is in the same direction, the terms in (7) to (9) can be regarded as the absolute values of the wave vectors.

One type of phase matching, known as quasi-phase-matching (QPM), is achieved by modulating the polarizing properties of the waveguide 31 so that the first sections 31a and second sections 31b have opposite natural polarization directions. If $l_1$ and $l_2$ are the respective lengths of the first sections 31a and second sections 31b, and $\Lambda = l_1 + l_2$ is the period of the combined structure, the QPM condition is given by the following equation (10), in which $\Delta k_x$ is $\Delta k_1$, $\Delta k_2$, or $\Delta k_3$, and m is a positive integer referred to as the order of the structure.

$$\Delta k_x = m(2\pi/\Lambda) \quad (10)$$

When the QPM condition given by equation (10) is satisfied, wavelength conversion can be realized through second-harmonic generation (if x=1 or 2) or sum-frequency generation (if x=3). For efficient QPM, when the order m in equation (10) is odd, the sections 31a and 31b should be formed with equal lengths, so that:

$$l_1 = l_2 \quad (11)$$

When the order m is even, better efficiency is obtained if the lengths of the sections are unequal. When m=2, for example, for maximum efficiency the lengths should be in the ratio 3:1, so that:

$$l_1 = 3l_2 \text{ or } 3l_1 = l_2 \quad (12)$$

Another type of phase matching, referred to as balanced phase-matching (BPM), can be used to generate the second harmonic of a fundamental wavelength X by providing the sections 31a and 31b with different refractive index distribution characteristics. If $l_1$ and $l_2$ are as above and the phase mismatch terms are $\Delta k_1'$ in the first sections 31a and $\Delta k_2'$ in the second sections 31b, then the required condition is given by the following equation (13), in which M is an integer equal to or greater than zero.

$$\Delta k_1' \cdot l_1 + \Delta k_2' \cdot l_2 = M \cdot 2\pi \tag{13}$$

If $n_1(\lambda)$ and $n_2(\lambda)$ are the refractive indexes with respect to an ordinary ray and an extraordinary ray of the fundamental wavelength $\lambda$, then $\Delta k_1'$ and $\Delta k_2'$ are given by the following equations.

$$\Delta k_1' = (4\pi/\lambda) \cdot [n_1(\lambda/2) - n_1(\lambda)] \tag{14}$$

$$\Delta k_2' = (4\pi/\lambda) \cdot [n_2(\lambda/2) - n_2(\lambda)] \tag{15}$$

A segmented KTP waveguide propagates both ordinary and extraordinary rays, making it possible to realize BPM. Since the wavelength distribution characteristics of $n_1$ and $n_2$ differ, it is possible for $\Delta k_1'$ and $\Delta k_2'$ to differ in sign. In particular, the condition for M=0 can be satisfied, giving:

$$\Delta k_1' \cdot l_1 + \Delta k_2' \cdot l_2 = 0 \tag{16}$$

$$\Delta k_1' \cdot l_1 = -\Delta k_2' \cdot l_2 \tag{17}$$

It is possible to satisfy two or more phase-matching conditions at once, so that two or more output wavelengths are obtained. For example, input wavelengths of 1017.0 nm and 717.9 nm can be simultaneously converted to output wavelengths of 508.5 nm (the second harmonic of 1017.0 nm, using BPM), 420.8 nm (sum frequency of 1017.0 nm and 717.9 nm, using QPM with m=1), and 358.9 nm (second harmonic of 717.9 nm, using QPM with m=2).

To achieve phase matching, the device in FIG. 2 places stringent conditions on the wavelengths of the input light. The three output wavelengths listed above were obtained by using tunable titanium-sapphire lasers, pumped by an argon laser, as sources of the input light. Light sources of this type are difficult to employ in practical applications. A practical wavelength conversion device should be able to use ordinary semiconductor laser diodes as light sources, but such laser diodes are incapable of producing wavelengths with the precision required for phase matching in FIG. 2. Their output wavelengths are prone to vary in response to current and temperature fluctuations.

Prior Art 3

FIG. 3 shows a third type of wavelength conversion device, which is disclosed in 0 plus E, January 1993, page 113, and in which a semiconductor laser diode 41 generates pumping light which is input through a collimating lens 43 and focusing lens 45 to a neodymium-doped yttrium-aluminum-garnet (Nd:YAG) rod laser 47. Laser oscillation occurs in the Nd:YAG rod 47, and the resulting laser light is input to a KTP crystal 49, which generates its second harmonic frequency. The original wavelength output by the laser diode 41 is thus converted first to the lasing wavelength of the Nd:YAG rod 47, then to light having a wavelength equal to half this lasing wavelength.

The device in FIG. 3 can use a single semiconductor laser diode as a light source, but it requires two separate further elements, the Nd:YAG rod 47 and KTP crystal 49, to obtain the desired output wavelength. For reasons of size and structural simplicity, it is preferable that a wavelength conversion device be configured as a single optical element.

Prior Art 1 and 2 are disadvantageous in that light from two sources must be mixed and input into a single waveguide, requiring complex lens-and-mirror apparatus of the type illustrated in FIG. 1. Prior Art 2 has the further disadvantage of requiring input light with finely tuned wavelengths. Prior Art 3 has the disadvantage of requiring multiple elements.

SUMMARY OF THE INVENTION

An object of the present invention is to provide a wavelength conversion device comprising a single optical element and operating from a single light source.

Another object of the invention is to enable this light source to be a semiconductor laser diode.

Still another object is to use the wavelength conversion device to stabilize the operation of the semiconductor laser diode.

Yet another object is to obtain multiple output wavelengths from a single input wavelength.

Still another object is to align the propagation direction of the output light with the propagation direction of the input light.

The invented wavelength conversion device comprises a nonlinear optical crystal to which a laser-active material has been added, so that when light of a first wavelength $\lambda_1$ is input from a light source, laser light of a second wavelength $\lambda_2$ is obtained. In addition, the device has a phase-matching structure so that light of at least one further wavelength, different from $\lambda_1$ and $\lambda_2$, is obtained by a nonlinear optical interaction. Examples of such interactions include second-harmonic generation acting on $\lambda_1$ or $\lambda_2$, and sum-frequency or difference-frequency generation acting on $\lambda_1$ and $\lambda_2$.

Use of optical waveguides doped with a laser-active material is disclosed in Lallier et al., "Laser oscillation of single-mode channel waveguide in Nd:MgO:LiNbO$_3$," Electronics Letters, Vol. 25, No. 22 (Oct. 26, 1989), pp. 1491–1492. According to this publication, light with a wavelength of 0.814 μm from a dye laser has been directed into a waveguide formed in an LiNbO$_3$ substrate doped with neodymium (Nd) and magnesium oxide (MgO), resulting in laser oscillation and output of laser light with a wavelength of 1.084 μm. More specifically, the waveguide was a stripe-geometry waveguide 8 μm wide formed in an X-cut in the Nd:MgO:LiNbO$_3$ substrate by the ion-exchange method using benzoic acid, the stripe being oriented in the Y-direction. The invention has been achieved by utilization of this technique.

According to a further aspect of the invention, the wavelength conversion device also has a Bragg reflection structure that reflects part of the input light of wavelength $\lambda_1$ back toward the light source. This permits use of a semiconductor laser diode light source, the reflected light helping to stabilize laser oscillation of the laser diode at a frequency corresponding to $\lambda_1$.

The same structure may be employed as both the phase-matching structure and the Bragg reflection structure, or separate structures within the same nonlinear optical crystal may be employed for phase matching and Bragg reflection.

DETAILED DESCRIPTION OF PREFERRED EMBODIMENTS

Embodiments of the invention will be described below with reference to the drawings. The drawings employed in the descriptions merely show the dimensions, shapes, and positional relationships of their component elements schematically, so as to furnish an understanding of the invention. Also, the materials, processing methods, and numerical conditions such as temperatures, processing times, and dimensions of parts mentioned in the following descriptions are merely examples within the scope of the invention.

Figure 4:
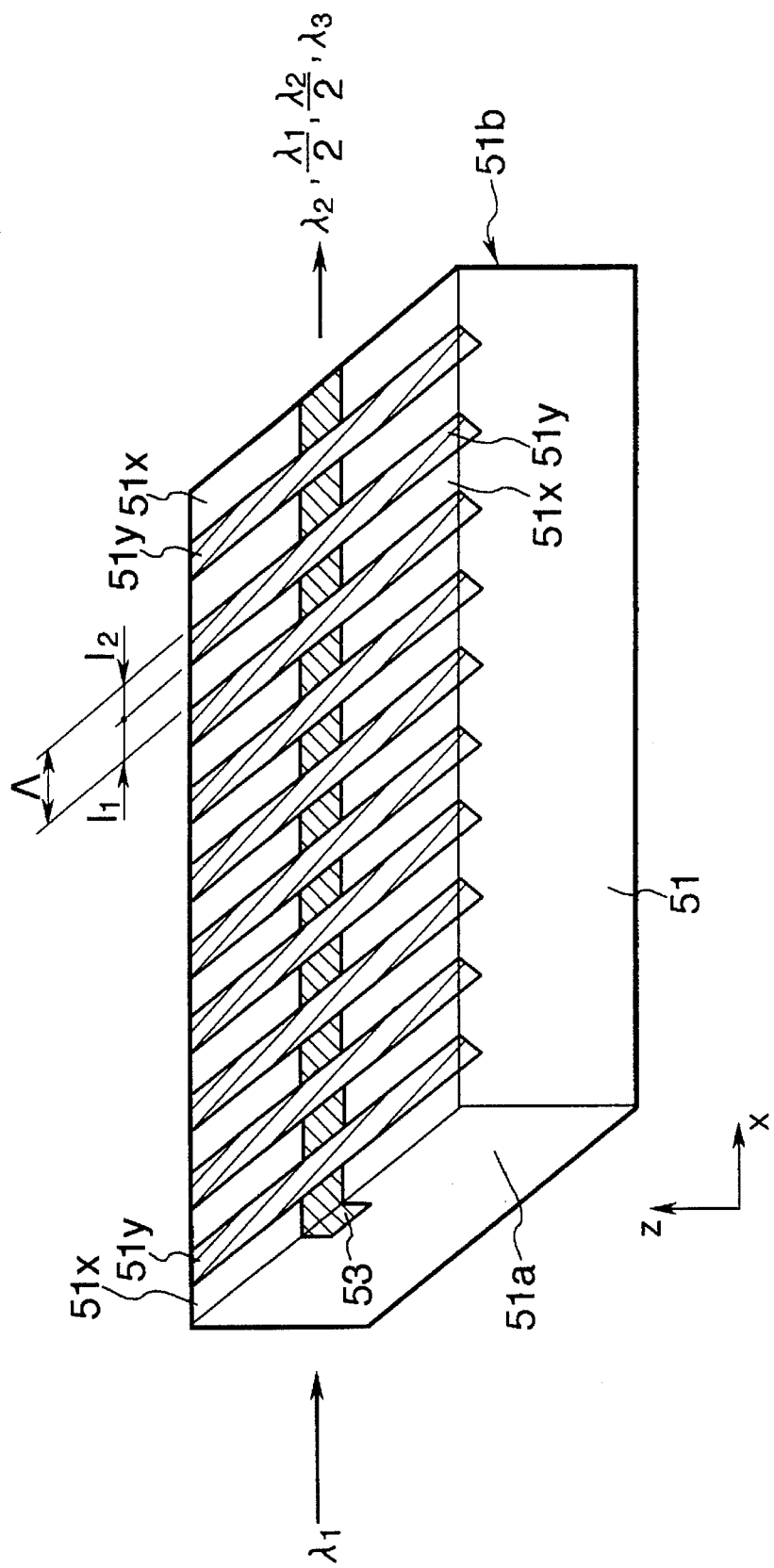
FIG. 4 illustrates several embodiments of the invention.

FIG. 4 shows a general structure common to several of the embodiments, i.e., Embodiments 1 to 7. This structure will be described first; specific embodiments will be described later.

The wavelength conversion device in FIG. 4 comprises a Z-cut lithium niobate crystalline substrate 51 doped with neodymium and magnesium oxide, which will be referred to hereinafter as a Z-cut Nd:MgO:LiNbO$_3$ substrate 51, or simply as the "substrate 51." Lithium niobate is a well-known nonlinear optical crystal. Neodymium is added as a laser-active material. Magnesium oxide is added to avoid photorefractive damage by the input light, and is not directly related to the wavelength conversion function.

The invention is not restricted to the use of lithium niobate and neodymium. Examples of other nonlinear optical crystals that can be used include lithium tantalate (LiTaO$_3$) and KTP. Possible laser-active materials include not only neodymium but other rare-earth elements, such as erbium.

A stripe-geometry optical waveguide 53 is formed in one surface of the Z-cut Nd:MgO:LiNbO$_3$ substrate 51, the stripe being oriented in the X or Y direction. The entrance facet 51a and exit facet 51b of the optical waveguide 51 have coatings, not explicitly indicated in the drawing, that reflect completely or partially light of a certain wavelength $\lambda_2$. The length of the waveguide 53 is related to the wavelength $\lambda_2$ so as to form a Fabry-Perot resonator at this wavelength.

The substrate 51 is also furnished with a phase-matching structure comprising alternating sections 51x and 51y having differing optical properties. These sections 51x and 51y have the form of a pattern of stripes in the same surface of the substrate 51 as the waveguide 53, crossing the waveguide 53 at right angles. Measured in the direction of the waveguide 53, the first sections 51x have length $l_1$ and the second sections 51y have length $l_2$. A repeating periodic structure is thus created with a period $\Lambda$ equal to $l_1+l_2$, as shown in the drawing.

The nature of the difference between sections 51x and 51y will vary in different embodiments. In some embodiments the sections 51x and 51y will have opposite natural polarization directions, a structure referred to as domain inversion. This structure can be formed by, for example, thermal diffusion of titanium, or outdiffusion of lithium oxide (Li$_2$O).

In other embodiments sections 51x and 51y will differ in their refractive index characteristics. The refractive index of a nonlinear optical crystal varies according to the wavelength of the refracted light. In the following description, $n(\lambda)$ will denote the refractive index at an arbitrary wavelength $\lambda$, $n_1(\lambda)$ will denote the refractive index of the first sections 51x at wavelength $\lambda$, and $n_2(\lambda)$ will denote the refractive index of the second sections 51y at wavelength $\lambda$.

The refractive index in the waveguide 53 varies not only with wavelength but also with position; that is, with depth from the surface and distance from the center axis of the waveguide. The refractive index of interest in a waveguide is the so-called effective refractive index. In descriptions related to FIG. 4, $n_1(\lambda)$ and $n_2(\lambda)$ should be understood as referring to the effective refractive index. The symbols $N_1(\lambda)$ and $N_2(\lambda)$ will sometimes be used in these descriptions to indicate the effective refractive index explicitly.

Next the general operation of the wavelength conversion device in FIG. 4 will be described. Light of a certain wavelength $\lambda_1$ is input at the entrance facet 51a of the waveguide 53. This input light acts as pumping light, exciting electrons of the neodymium atoms in the waveguide 53. In falling back from their excited state, some of these electrons emit light of wavelength $\lambda_2$, which is reflected by the coatings at the ends of the waveguide 53. The well-known phenomenon of light amplification by stimulated emission of radiation then generates laser light of wavelength $\lambda_2$ within the waveguide 53. The coating on the exit facet 51b of the waveguide 53 is partially reflecting, so part of this light is emitted as output light of the wavelength conversion device. Thus input light of wavelength $\lambda_1$ is converted to output light of wavelength $\lambda_2$.

Nonlinear optical interactions in the waveguide 53 create one or more further output wavelengths, as described in the following specific embodiments. All the output light exits through the exit facet 51b, propagating in the same direction as the original input light of wave length $\lambda_1$.

Embodiment 1

The phase-matching structure is a quasi-phase-matching (QPM) structure, the first and second sections 51x and 51y having opposite natural polarization directions. The dimensions of the sections 51x and 51y are adapted to generate the second harmonic of at least one of the wavelengths $\lambda_1$ and $\lambda_2$.

The conditions for converting light of a wavelength $\lambda$ to its second harmonic, which has wavelength $\lambda'$, are:

$$\lambda' = \lambda/2 \tag{18}$$

$$k' = 2k \tag{19}$$

Equation (18) is an energy conservation condition. Equation (19) is a momentum conservation condition. The quantities k and k' in equation (19) are the absolute values of wave vectors of light of wavelengths $\lambda$ and $\lambda'$. More specifically, $\lambda = (2\pi/\lambda)n(\lambda)$ and $\lambda' = (4\pi/\lambda)n(\lambda/2)$, where $n(\lambda)$ and $n(\lambda/2)$ are the refractive indexes at wavelengths $\lambda$ and $\lambda/2$ of the waveguide 53 taken as a whole.

Because $n(\lambda)$ is not equal to $n(\lambda/2)$, equation (19) is not satisfied; there is a phase mismatch of $\Delta k$, defined by:

$$\Delta k = k' - 2k \tag{20}$$

From the definitions of $\lambda$ and $\lambda'$ given above, it follows that:

$$\Delta k = (4\pi/\lambda)[n(\lambda/2)) - n(\lambda)] \tag{21}$$

The phase-matching structure can compensate for this phase mismatch if the period $\Lambda=l_1+l_2$ satisfies the following condition, in which m is an integer greater than zero.

$$\Lambda = m \cdot (2\pi/\Delta k) \tag{22}$$

Equation (22) can be used to determine the sum $\Lambda$ of $l_1$ and $l_2$. Low values of m, such as one or two, are preferable, and if m is odd, $l_1$ and $l_2$ should be equal. If m is even, $l_1$ and $l_2$ should be unequal, and preferably satisfy further conditions that depend on m. If m=2, for example, then it is desirable to have either $l_1=3l_2$ or $3l_1=l_2$. These conditions on $l_1$ and $l_2$ apply not only in the first embodiment, but also in other embodiments using QPM.

To obtain the second harmonic of the input light of wavelength $\lambda_1$, the values of $l_1$ and $l_2$ in FIG. 4 are chosen so that for some positive integer m, $$\Lambda = m \cdot (2\pi/\Delta k_1) \tag{23}$$

The phase mismatch $\Delta k_1$ is given by $\Delta k_1 = k_{12} - 2k_1$, as in equation (20), where $k_1$ is the wave vector of the input light of wavelength $\lambda_1$, and $k_{12}$ is the wave vector of its second harmonic. Specifically, $k_1 = (2\pi/\lambda_1)n(\lambda_1)$, and $k_{12} = (4\pi/\lambda_1)n(\lambda_1/2)$. The converted output wavelengths are $\lambda_2$ and $\lambda_1/2$.

Because $\Delta k_1 = k_{12} - 2k_1$, the equation (23) can be rewritten as $$\Lambda = m \cdot \{2\pi/(k_{12} - 2k_1)\} \tag{24}$$

To obtain the second harmonic of the laser light of wavelength $\lambda_2$, the values of $l_1$ and $l_2$ should be chosen so that for some positive integer m, $$\Lambda = m \cdot (2\pi/\Delta k_2) \tag{25}$$

The phase mismatch $\Delta k_2$ is now given by $\Delta k_2 = k_{22} - 2k_2$, where $k_2$ is the wave vector of the laser light of wavelength $\lambda_2$, and $k_{22}$ is the wave vector of its second harmonic. Specifically, $k_2 = (2\pi/\lambda_2)n(\lambda_2)$, and $k_{22} = (4\pi/\lambda_2)n(\lambda_2/2)$. The converted output wavelengths are $\lambda_2$ and $\lambda_2/2$.

Because $\Delta k_2 = k_{22} - 2k_2$, the equation (25) can be rewritten as $$\Lambda = m \cdot \{2\pi/(k_{22} - 2k_2)\} \tag{26}$$

Figure 1:
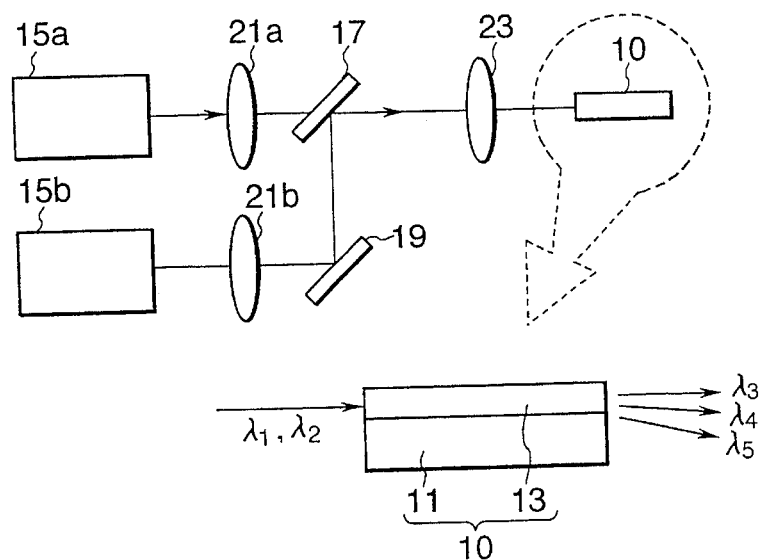
FIG. 1 is an explanatory drawing of Prior Art 1.
Figure 2:
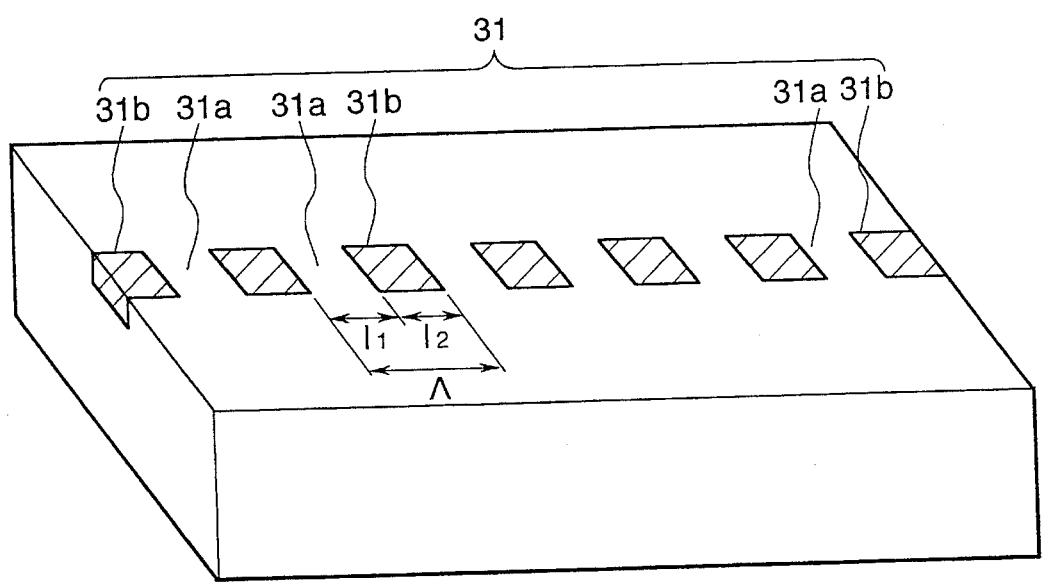
FIG. 2 is an explanatory drawing of Prior Art 2.
Figure 3:
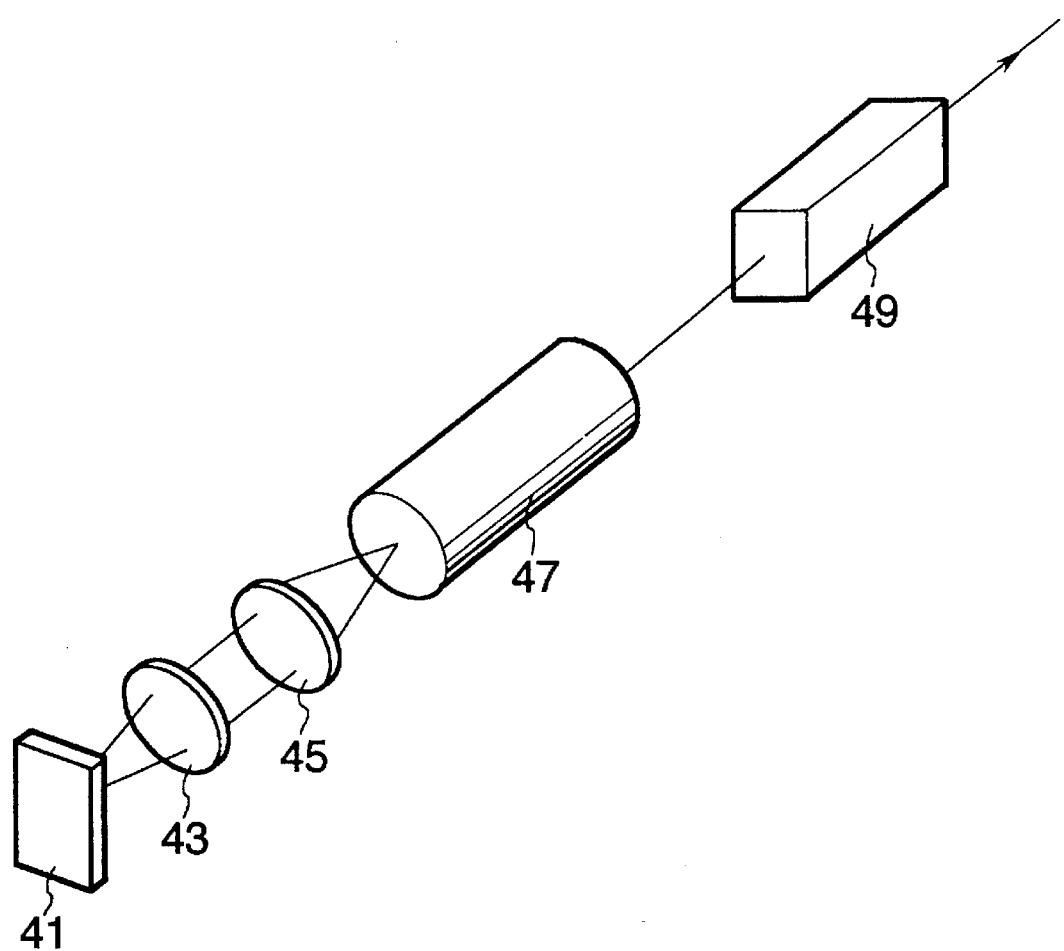
FIG. 3 is an explanatory drawing of Prior Art 3.

When this embodiment is configured for output of the second harmonic of the laser light, it provides the same type of output as in Prior Art 3, requiring only a single optical component instead of the two component elements 47 and 49 in FIG. 3.

Using different values of m, it may be possible to satisfy both equations (23) and (25), in which case the converted output wavelengths are $\lambda_2$, $\lambda_1/2$, and $\lambda_2/2$.

Embodiment 2

The phase-matching structure is again a quasi-phase-matching (QPM) structure, the first and second sections 51x and 51y having opposite natural polarization directions. The dimensions of the sections 51x and 51y are adapted so as to generate the sum frequency or difference frequency of the wavelengths $\lambda_1$ and $\lambda_2$. The converted output wavelengths are $\lambda_2$, and $1/(1/\lambda_1 + 1/\lambda_2$ or $1/(1/\lambda_1 - 1/\lambda_2)$.

If $\lambda_3$ represents the wavelength of light with the sum frequency or difference frequency, and $k_3$ is its wave vector, the phase mismatch $\Delta k$ is now:

$$\Delta k = k_3 - k_1 \pm k_2 \tag{27}$$

where the final ± sign symbol should be interpreted as a minus symbol for sum frequency generation, and a plus symbol for difference frequency generation. This equation can be written more explicitly as follows.

$$\Delta k = (4\pi/\lambda_3)N(\lambda_3) - (4\pi/\lambda_1)N(\lambda_1)$$

$$\pm (4\pi/\lambda_2)N(\lambda_2) \tag{28}$$

Here, $N(\lambda_1)$, $N(\lambda_2)$ and $N(\lambda_3)$ are effective refractive indexes at wavelengths $\lambda_1$, $\lambda_2$ and $\lambda_3$.

The dimensions 11 and 12 should be chosen so that their sum $\Lambda$ satisfies equation (22) when equation (28) is used to evaluate $\Delta k$.

Embodiment 3

The phase-matching structure is now a balanced phase-matching (BPM) structure, the first and second sections 51x and 51y differing in their refractive index characteristics $n_1(\lambda)$ and $n_2(\lambda)$. These characteristics are selected so as to generate the second harmonic of either the input light of wavelength $\lambda_1$ or the laser light of wavelength $\lambda_2$. The converted output wavelengths are $\lambda_2$, and $\lambda_1/2$ or $\lambda_2/2$.

The principle is the same for either wavelength, so in the following description, both wavelengths will be denoted by the symbol $\lambda_x$ (x=1 or 2).

The requirement for BPM is $\Delta k_1' \cdot l_1 + \Delta k_2' \cdot l_2 = M \cdot 2\pi$, where M is an integer equal to or greater than zero. The phase mismatch terms $\Delta k_1'$ and $\Delta k_2'$ are given by the following equations (29) and (30).

$$\Delta k_1' = (4\pi/\lambda_x)[n_1(\lambda_x/2)) - n_1(\lambda_x)] \tag{29}$$

$$\Delta k_2' = (4\pi/\lambda_x)[n_2(\lambda_x/2)) - n_2(\lambda_x)] \tag{30}$$

Embodiment 4

The phase-matching structure has the first and second sections 51x and 51y differing in their refractive index characteristics $n_1(\lambda)$ and $n_2(\lambda)$, and is both a balanced phase-matching structure and a quasi-phase-matching structure, adapted to produce the second harmonic of the input light of wavelength $\lambda_1$ by SHG BPM, and the second harmonic of the laser light of wavelength $\lambda_2$ by SHG QPM. The converted output wavelengths are $\lambda_2$, $\lambda_1/2$, and $\lambda_2/2$.

When x=1, equations (29) and (30) can be rewritten as equations (31) and (32) below.

$$\Delta k_1' = (4\pi/\lambda_1)[n_1(\lambda_1/2)) - n_1(\lambda_1)] \tag{31}$$

$$\Delta k_2' = (4\pi/\lambda_1)[n_2(\lambda_1/2)) - n_2(\lambda_1)] \tag{32}$$

For BPM with respect to the input light, the dimensions $l_1$ and $l_2$ must satisfy equation (33) below, in which $\Delta k_1'$ is given by equation (31) and $\Delta k_2'$ by equation (32).

$$\Delta k_1' \cdot l_1 + \Delta k_2' \cdot l_2 = M \cdot 2\pi \tag{33}$$

For QPM with respect to the laser light of wavelength $\lambda_2$, the sum $\Lambda$ of $l_1$ and $l_2$ must satisfy equation (34).

$$\Lambda = m \cdot (2\pi/\Delta k_2) \tag{34}$$

Since $\Delta k_2 = k_{22} - 2k_2$, the equation (34) can be rewritten as:

$$\Lambda = m \cdot \{2\pi/(k_{22} - 2k_2)\} \tag{35}$$

Further desirable conditions on 11 and 12 are as noted under equation (22): $l_1 = l_2$ if m is odd, $l_1 \neq l_2$ if m is even, and $3l_1 = l_2$ or $l_1 = 3l_2$ when m=2.

Embodiment 5

The phase-matching structure has the first and second sections 51x and 51y differing in their refractive index characteristics $n_1(\lambda)$ and $n_2(\lambda)$, and is again both a balanced phase-matching structure and a quasi-phase-matching structure, but is now adapted to produce the second harmonic of the input light of wavelength $\lambda_1$ by SHG QPM and the second harmonic of the laser light of wavelength $\lambda_2$ by SHG BPM. This is the reverse of the preceding embodiment. The converted output wavelengths are again $\lambda_2$, $\lambda_1/2$, and $\lambda_2 2$.

The conditions are the same as in the preceding embodiment, except that $\lambda_2$ should be replaced by $\lambda_1$ and vice versa in equations (31), (32), and (34).

That is, when x=1, equations (29) and (30) can be rewritten as equations (36) and (37) below.

$$\Delta k_1' = (4\pi/\lambda_2)[n_1(\lambda_2/2))-n_1(\lambda_2)] \quad (36)$$

$$\Delta k_2' = (4\pi/\lambda_2)[n_2(\lambda_2/2))-n_2(\lambda_2)] \quad (37)$$

For BPM with respect to the input light, the dimensions $l_1$ and $l_2$ must satisfy equation (38) below, in which $\Delta k_1'$ is given by equation (36) and $\Delta k_2'$ by equation (37).

$$\Delta k_1' \cdot l_1 + \Delta k_2' \cdot l_2 = M \cdot 2\pi \quad (38)$$

For QPM with respect to the laser light of wavelength $\lambda_1$, the sum $\Lambda$ of $l_1$ and $l_2$ must satisfy equation (39).

$$\Lambda = m \cdot (2\pi/\Delta k_1) \quad (39)$$

Since $\Delta k_1 = k_{12} - 2k_1$, the equation (39) can be rewritten as:

$$\Lambda = m \cdot \{2\pi/(k_{12}-2k_1)\} \quad (40)$$

Further desirable conditions on $l_1$ and $l_2$ are as noted under equation (22): $l_1 = l_2$ if m is odd, $l_1 \approx l_2$ if m is even, and $3l_1 = l_2$ or $l_1 = 3l_2$ when m=2.

Embodiment 6

The phase-matching structures of some of the preceding embodiments can also be made to satisfy a Bragg condition with respect to the input wavelength $\lambda_1$. That is, the same periodic structure can be both a phase-matching structure and a Bragg reflection structure. If the Bragg reflection condition is satisfied, part of the input light of wavelength $\lambda_1$ will be reflected back out from the entrance facet and will return to the original light source. If the light source is a semiconductor laser diode, this return light can be used for wavelength control.

The Bragg condition can be satisfied by choosing $l_1$ and $l_2$ so that their sum $\Lambda$ satisfies the following equation (41).

$$\Lambda = [(p/q) \cdot \lambda_1]/[2N(\lambda_1)] \quad (41)$$

In this equation, p and q are integers greater than zero, and $N(\lambda_1)$ is the effective refractive index in the wavelength conversion device as a whole for the input wavelength $\lambda_1$. This $N(\lambda_1)$ is given approximately by the following equation (42).

$$N(\lambda_1) = [l_1 \cdot n(\lambda_1) + l_2 n(\lambda_1)]/\Lambda \quad (42)$$

The coating on the entrance facet of the waveguide 53 must be adapted to provide sufficient reflection at wavelength $\lambda_2$ for laser oscillation, but must be sufficiently transparent at wavelength $\lambda_1$ for adequate return of reflected light to the light source. These conditions can be satisfied by selection of a suitable partially reflecting coating. Alternatively, laser oscillation can be obtained by applying an anti-reflective coating instead of a reflective coating, and providing a Bragg resonator in the optical waveguide 53. A structure providing a Bragg resonator is disclosed in Japanese Patent Kokai Publication No. 291,655/1993.

Figure 5:
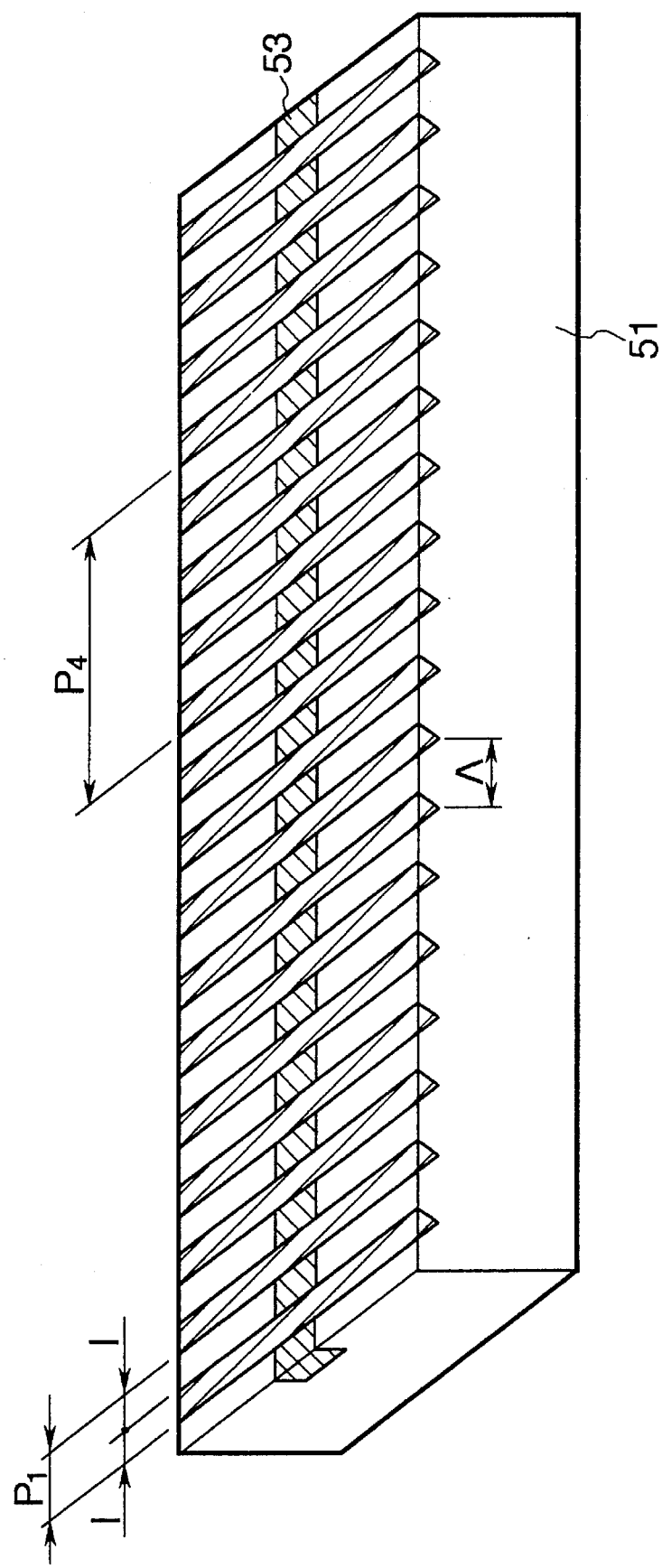
FIG. 5 illustrates different periods of a Bragg reflection structure.

If the value of p is changed in the above equation (41), the period of the Bragg reflection structure changes accordingly. FIG. 5 shows how the period of the Bragg reflection structure differs for the case of p=1 and the case of p=4 in the wavelength conversion device of FIG. 4. $P_1$ is in FIG. 5 one period of the Bragg reflection structure when p=1, and $P_4$ is one period when p=4. The larger p is, the longer the effective period of the Bragg reflection structure becomes.

Figure 6:
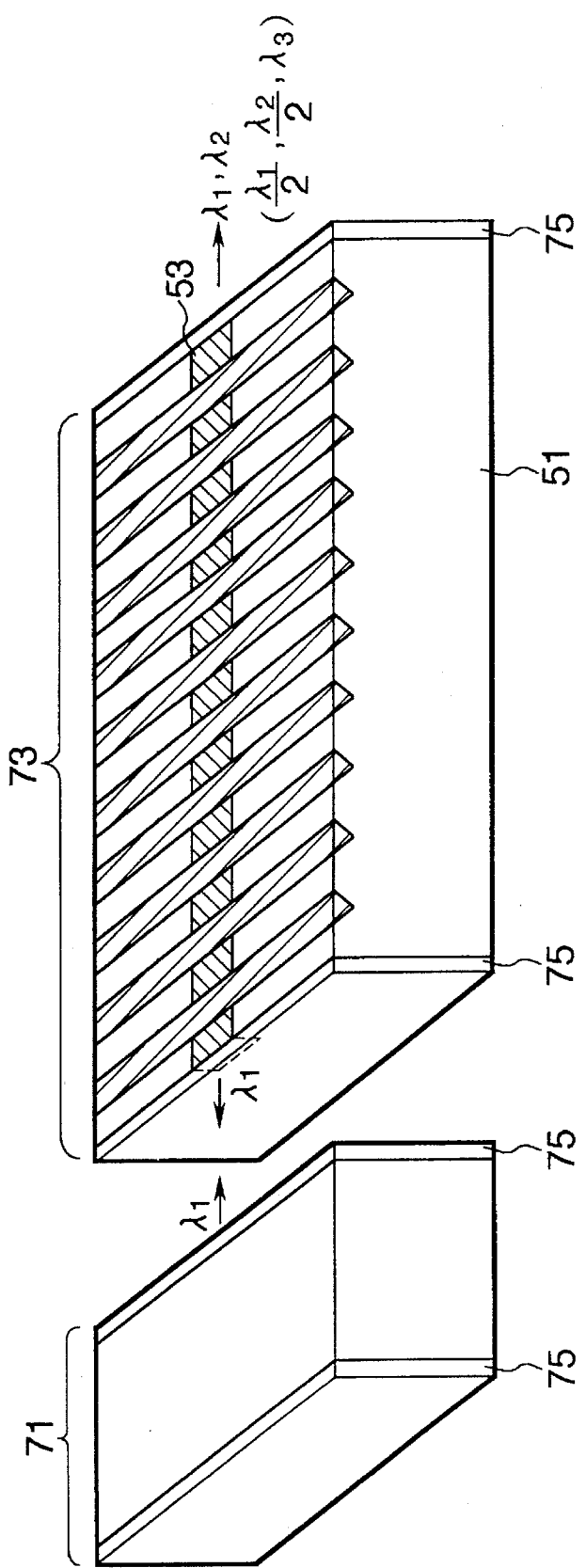
FIG. 6 illustrates use of the invention with a semiconductor laser diode.

FIG. 6 shows this embodiment being used with a semiconductor laser diode 71 as a source of input light. The semiconductor laser 71 and wavelength conversion device 73 are aligned facing one another, so that a beam of light of wavelength $\lambda_1$ from the laser diode 71 enters the waveguide 53 in the wavelength conversion device 73. Anti-reflection coatings 75 are preferably applied to at least the mutually facing ends of the semiconductor laser 71 and wavelength conversion device 73. Return light of wavelength $\lambda_1$ is fed back from the wavelength conversion device 73 to the semiconductor laser 71. This feedback tends to stabilize the output of the semiconductor laser diode 71 at a wavelength of $\lambda_1$, because if the output wavelength begins to deviate from $\lambda_1$, less light is reflected back. The Bragg reflection structure in the wavelength conversion device 73 accordingly reduces the sensitivity of the wavelength to variations in, for example, driving current and ambient temperature.

This capability of the invented wavelength conversion device to stabilize the wavelength of the light source is of great value in many practical applications, in which a semiconductor laser diode light source is strongly desired.

Embodiment 7

Figure 7:
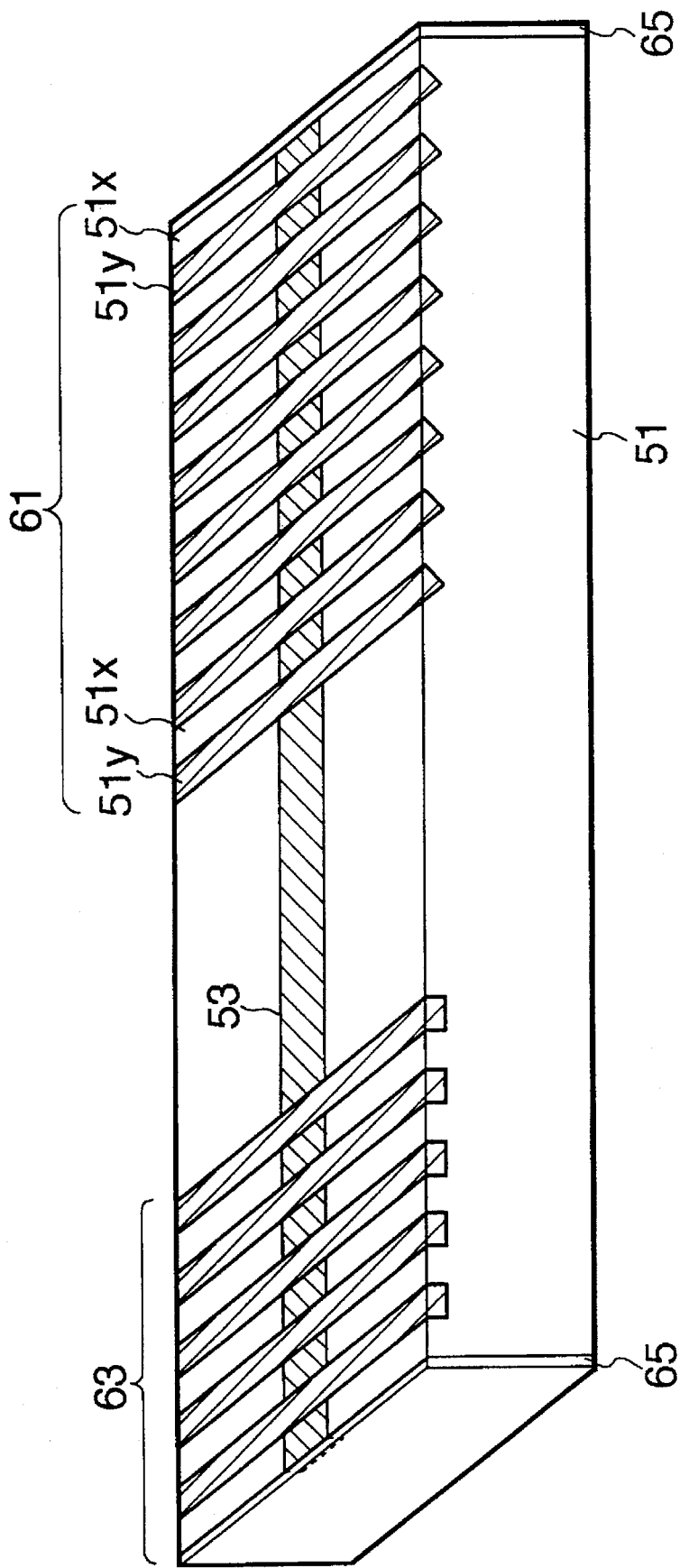
FIG. 7 illustrates separate phase-matching and Bragg reflection structures.

The Bragg reflection structure of the preceding embodiment need not be the same as the phase-matching structure; separate structures can be provided, which gives greater freedom in device design. FIG. 7 shows a wavelength conversion device of the type that provides the two separately. The substrate 51 and waveguide 53 are as described in any of the preceding embodiments. The phase-matching structure 61 at one end of the device comprises sections 51x and 51y designed to satisfy the conditions in any of embodiments 1 to 5. The Bragg reflection structure 63 at the other end of the device is designed to satisfy equation (41).

The coatings 65 on the entrance and exit facets of the substrate 51 should be designed to provide the necessary transmission of input light of wavelength $\lambda_1$ and partial reflection of light of wavelength $\lambda_2$. In particular, the coating 65 on the entrance facet (the left end in the drawing) should be an anti-reflective coating at wavelength $\lambda_1$.

Instead of providing a Bragg reflection structure 63 at one end and a phase-matching structure at the other, it is possible to provide a Bragg reflection structure at both ends with a phase-matching structure disposed between them in the middle, a configuration that will enhance the conversion efficiency.

Embodiment 8

The wavelength conversion devices described above have all been of the waveguide type, but the invention is not restricted to this type. For example, a bulk nonlinear optical crystal can be cut at certain angles so as to obtain angular phase matching, instead of using BPM or QPM. Such a bulk nonlinear optical crystal is described in Tatsuno, "Modern Optics for Freshmen—VII", Optics Vol. 23, No. 1 (January 1994), pp. 58–64, which is incorporated herein by reference. The same advantages can thereby be obtained as in the embodiments described above, with multiple wavelengths light being output aligned in the direction of propagation of the input light.

Embodiment 9

A method of obtaining a layered domain inversion structure by grounding the +Z surface of a $LiNbO_3$ or $LiTaO_3$ nonlinear optical crystal and scanning the −Z surface with a focused electron beam has been disclosed in Suhara et al., "Quasi-Phase Matching", Applied Physics (The Japan Society of Applied Physics), Vol. 62, No. 9 (1993), pp. 927–928. This method produces a layered structure extending clear through the bulk crystal. It is thought that the present invention can be practiced by using this method to form a phase-matching structure in a bulk nonlinear optical crystal doped with a laser-active material.

Modifications

Those skilled in the art will recognize that further modifications are possible without departing from the scope of the invention as claimed below.

What is claimed is:

1. A wavelength conversion device for converting input light of a first wavelength $\lambda_1$ to output light of a plurality of wavelengths different from $\lambda_1$, comprising a nonlinear optical crystal, wherein:

said nonlinear optical crystal is doped with a laser-active material which is excited by input of light of said first wavelength $\lambda_1$, thereby causing laser oscillation in said nonlinear optical crystal and generating laser light of a second wavelength $\lambda_2$; and a phase-matching structure is formed in said nonlinear optical crystal, permitting generation of light of at least one additional wavelength, related to at least one of said first wavelength $\lambda_1$ and said second wavelength $\lambda_2$, by a nonlinear optical effect, wherein said phase-matching structure comprises alternating sections of said nonlinear crystal having different natural polarization directions.

2. The wavelength conversion device of claim 1, wherein an optical waveguide is formed in said nonlinear optical crystal and said input light is input to said optical waveguide.

3. The wavelength conversion device of claim 1, wherein said alternating sections comprises first sections of length $l_1$ alternating with second sections of length $l_2$ and the sum $\Lambda$ of $l_1$ and $l_2$ satisfies at least one of $$\Lambda = m \cdot [2\pi/(k_{12}-2k_1)], \text{ and}$$

$$\Lambda = m \cdot [2\pi/(k_{22}-2k_2)],$$

in which m is an integer greater than zero, $k_1$ is a wave vector of said input light of wavelength $\lambda_1$, $k_{12}$ is a wave vector of a second harmonic of said input light, $k_2$ is a wave vector of laser light of wavelength $\lambda_2$, and $k_{22}$ is a wave vector of a second harmonic of said laser light.

4. The wavelength conversion device of claim 1, wherein said alternating sections comprise first sections of length $l_1$ alternating with second sections of length $l_2$ and the sum $\Lambda$ of $l_1$ and $l_2$ satisfies $$\Lambda = m \cdot [2\pi/(\Delta k = k_3 - k_1 - k_2)]$$

in which m is an integer greater than zero, $k_1$ is a wave vector of said input light of wavelength $\lambda_1$, $k_2$ is a wave vector of laser light of wavelength $\lambda_2$, and $k_3$ is a wave vector of light having a wavelength equal to $1/(1/\lambda_1+1/\lambda_2)$.

5. The wavelength conversion device of claim 1, wherein said alternating sections comprise first sections of length $l_1$ alternating with second sections of length $l_2$ and the sum $\Lambda$ of $l_1$ and $l_2$ satisfies $$\Lambda = m \cdot [2\pi/(\Delta k = k_3 - k_1 + k_2)]$$

in which m is an integer greater than zero, $k_1$ is a wave vector of said input light of wavelength $\lambda_1$, $k_2$ is a wave vector of laser light of wavelength $\lambda_2$, and $k_3$ is a wave vector of light having a wavelength equal to $1/(1/\lambda_1-1/\lambda_2)$.

6. A wavelength conversion device for converting input light of a first wavelength $\lambda_1$ to output light of a plurality of wavelengths different from $\lambda_1$, comprising a nonlinear optical crystal, wherein:

said nonlinear optical crystal is doped with a laser-active material which is excited by input of light of said first wavelength $\lambda_1$, thereby causing laser oscillation in said nonlinear optical crystal and generating laser light of a second wavelength $\lambda_2$; and a phase-matching structure is formed in said nonlinear optical crystal, permitting generation of light of at least one additional wavelength, related to at least one of said first wavelength $\lambda_1$ and said second wavelength $\lambda_2$, by a nonlinear optical effect, wherein said phase-matching structure is configured by cutting said nonlinear optical crystal at an angle such that angular phase matching is obtained.

7. A wavelength conversion device for converting input light of a first wavelength $\lambda_1$ to output light of a plurality of wavelengths different from $\lambda_1$, comprising a nonlinear optical crystal, wherein:

said nonlinear optical crystal is doped with a laser-active material which is excited by input of light of said first wavelength $\lambda_1$, thereby causing laser oscillation in said nonlinear optical crystal and generating laser light of a second wavelength $\lambda_2$;

a phase-matching structure is formed in said nonlinear optical crystal permitting generation of light of at least one additional wavelength, related to at least one of said first wavelength $\lambda_1$ and said second wavelength $\lambda_2$, by a nonlinear optical effect; and which includes a Bragg reflection structure with a period $\Lambda$ that satisfies a Bragg condition $$\Lambda = [(p/q) \cdot \lambda_1]/[2N(\lambda_1)]$$

in which p and q are integers greater than zero, and $N(\lambda_1)$ is an effective refractive index of the wavelength conversion device for said input light of wavelength $\lambda_1$.

8. The wavelength conversion device of claim 7, wherein said Bragg reflection structure also serves as said phase-matching structure.

9. The wavelength conversion device of claim 7, wherein said Bragg reflection structure is separate from said phase-matching structure.

* * * * *